(12) United States Patent
Hashimoto et al.

(10) Patent No.: US 8,658,334 B2
(45) Date of Patent: Feb. 25, 2014

(54) TRANSFER MASK, METHOD OF MANUFACTURING A TRANSFER MASK, AND METHOD OF MANUFACTURING A SEMICONDUCTOR DEVICE

(75) Inventors: Masahiro Hashimoto, Tokyo (JP); Kazuya Sakai, Tokyo (JP); Toshiyuki Suzuki, Tokyo (JP); Kazunori Ono, Tokyo (JP)

(73) Assignee: Hoya Corporation, Tokyo (JP)

( * ) Notice: Subject to any disclaimer, the term of this patent is extended or adjusted under 35 U.S.C. 154(b) by 57 days.

(21) Appl. No.: 13/501,348

(22) PCT Filed: Oct. 8, 2010

(86) PCT No.: PCT/JP2010/067730
§ 371 (c)(1),
(2), (4) Date: Jun. 19, 2012

(87) PCT Pub. No.: WO2011/046073
PCT Pub. Date: Apr. 21, 2011

(65) Prior Publication Data
US 2012/0251931 A1    Oct. 4, 2012

(30) Foreign Application Priority Data
Oct. 12, 2009 (JP) ................... 2009-235817

(51) Int. Cl.
*G03F 1/50* (2012.01)
*B08B 3/00* (2006.01)

(52) U.S. Cl.
USPC .................................. 430/5; 134/26

(58) Field of Classification Search
USPC ................... 430/5, 319; 134/26, 36
See application file for complete search history.

(56) References Cited

U.S. PATENT DOCUMENTS

| 7,767,367 B2 | 8/2010 | Yoshikawa et al. |
| 7,989,124 B2 | 8/2011 | Yoshikawa et al. |
| 2009/0246647 A1 | 10/2009 | Hashimoto et al. |

FOREIGN PATENT DOCUMENTS

| JP | 2002-156742 A | 5/2002 |
| JP | 2007-241060 A | 9/2007 |
| WO | 2008/139904 A1 | 11/2008 |

OTHER PUBLICATIONS

International Search Report for PCT/JP2010/067730 dated Dec. 21, 2010, English Translation.

*Primary Examiner* — Stephen Rosasco
(74) *Attorney, Agent, or Firm* — Sughrue Mion, PLLC

(57) ABSTRACT

Provided is a transfer mask which has a transfer pattern formed in a pattern-forming thin film provided on a transparent substrate and is adapted to be applied with exposure light having a wavelength of 200 nm or less. The pattern-forming thin film is made of a material containing silicon an a transition metal other than chromium and the chromium content in the film is less than $1.0 \times 10^{18}$ atoms/cm$^3$.

25 Claims, 4 Drawing Sheets

TRANSFER MASK, METHOD OF MANUFACTURING A TRANSFER MASK, AND METHOD OF MANUFACTURING A SEMICONDUCTOR DEVICE

TECHNICAL FIELD

This invention relates to a transfer mask improved in light resistance, a method of manufacturing the transfer mask, and so on. In particular, this invention relates to a transfer mask to be suitably used in an exposure apparatus using exposure light having a short wavelength of 200 nm or less as an exposure light source, to a method of manufacturing the transfer mask, and to a method of manufacturing a semiconductor device.

BACKGROUND ART

Generally, fine pattern formation is carried out by the photolithography in manufacturing processes of a semiconductor device. A number of transfer masks (photomasks) are normally used for this fine pattern formation. The transfer mask comprises generally a transparent substrate having thereon a fine pattern made of a metal thin film or the like. The photolithography is used also in the manufacture of the transfer mask.

In the manufacture of a transfer mask by the photolithography, use is made of a mask blank having a thin film (e.g. light-shielding film or the like) for forming a transfer pattern (mask pattern) on a transparent substrate such as a glass substrate.

The manufacture of the transfer mask using the mask blank comprises an exposure process of applying required pattern writing to a resist film formed on the mask blank, a developing process of developing the resist film according to the required pattern writing to form a resist pattern, an etching process of etching the thin film according to the resist pattern, and a process of stripping and removing the remaining resist pattern.

In the developing process, a developer is supplied after applying the required pattern writing (exposure) to the resist film formed on the mask blank to dissolve a portion of the resist film soluble in the developer, thereby forming the resist pattern. In the etching process, using this resist pattern as a mask, an exposed portion of the thin film, where the resist pattern is not formed, is dissolved by dry etching or wet etching, thereby forming a required transfer pattern on the transparent substrate. In this manner, the transfer mask is manufactured.

For miniaturization of a pattern of a semiconductor device, it is necessary to shorten the wavelength of an exposure light source for use in the photolithography in addition to the miniaturization of the transfer pattern formed in the transfer mask. In recent years, the wavelength of an exposure light source in the manufacture of a semiconductor device has been shortened from KrF excimer laser (wavelength 248 nm) to ArF excimer laser (wavelength 193 nm).

As a type of transfer mask, a halftone phase shift mask is known apart from a conventional binary mask having a light-shielding film pattern made of a chromium-based material on a transparent substrate. This halftone phase shift mask is configured to have a light-semitransmitting film (halftone phase shift film) on a transparent substrate. This light-semitransmitting film is made of, for example, a material containing a molybdenum silicide compound or the like and is adapted to transmit light having an intensity that does not substantially contribute to exposure (e.g. 1% to 20% at an exposure wavelength) and to give a predetermined phase difference to this transmitted light. By means of light-semitransmitting portions formed by patterning the light-semitransmitting film and light-transmitting portions formed with no light-semitransmitting film and thus adapted to transmit exposure light, the halftone phase shift mask provides a relationship in which the phase of the light transmitted through the light-semitransmitting portions is substantially inverted with respect to the phase of the light transmitted through the light-transmitting portions (i.e. shifts the phase). As a consequence, the lights having passed near the boundaries between the light-semitransmitting portions and the light-transmitting portions and bent into the others' regions due to the diffraction phenomenon cancel each other out. This makes the light intensity at the boundaries approximately zero to thereby improve the contrast, i.e. the resolution, at the boundaries.

Further, in the exposure technique using ArF excimer laser (wavelength 193 nm) as exposure light, the miniaturization of a transfer pattern has advanced to require coping with the pattern line width which is smaller than the wavelength of the exposure light. As a consequence, there have been developed the resolution enhancement technology, such as the oblique illumination method and the phase shift method, and further the hyper-NA technique with NA=1 or more (immersion exposure etc.).

With the advance of transfer pattern miniaturization, the width of a resist pattern has been narrowed. Therefore, the aspect ratio becomes high with the thickness of a conventional resist film so that it is becoming difficult to form a transfer pattern by dry-etching a light-shielding film using the resist pattern as a mask.

As one means for solving this problem, there has been developed a binary mask blank having a structure in which a light-shielding film capable of being dry-etched with a fluorine-based gas is formed by a film containing a transition metal and silicon and an etching mask film made of a chromium-based material is formed on the light-shielding film (Patent Document 1). A method of manufacturing a transfer mask from this mask blank comprises first forming a resist pattern on the etching mask film and then using the resist pattern as a mask to carry out dry etching using a mixed gas of chlorine and oxygen as an etching gas, thereby forming a transfer pattern in the etching mask film. Then, using the transfer pattern of the etching mask film as a mask, dry etching is carried out using a fluorine-based gas as an etching as, thereby forming a transfer pattern in the light-shielding film. Then, the etching mask film is removed and, through a predetermined cleaning process, a binary transfer mask is manufactured.

PRIOR ART DOCUMENT

Patent Document

Patent Document 1: JP-A-2007-241060
Patent Document 2: JP-A-2002-156742

SUMMARY OF THE INVENTION

Problem to be Solved by the Invention

In the meantime, since the manufacturing cost of a transfer mask such as a binary mask or a halftone phase shift mask has been significantly increasing following the pattern miniaturization in recent years, there is an increasing need for a longer lifetime of the transfer mask.

As a factor for determining the lifetime of the transfer mask, there is a problem of transfer mask degradation caused by the repeated use of the transfer mask due to its repeated cleaning. Conventionally, for example, when haze (foreign matter composed mainly of ammonium sulfide and generated on the transfer mask) is generated, cleaning is carried out for removing the haze. However, the film loss (film dissolution) due to the cleaning cannot be avoided and thus, roughly, the number of times of cleaning determines the transfer mask lifetime.

In recent years, the number of times of cleaning of the transfer mask has been reduced due to the improvement of the haze countermeasure technique so that the period of time of the repeated use of the transfer mask has been prolonged. However, since the exposure time has also been prolonged correspondingly, a problem of the light resistance particularly to short-wavelength light such as ArF excimer laser has been newly actualized.

The present inventors have elucidated that, in the case of a binary mask containing a transition metal and silicon, a phenomenon occurs in which the width of a transfer pattern of a light-shielding film changes (increases) due to cumulative irradiation of ArF excimer laser (wavelength 193 nm) as an exposure light source beyond the conventional period of time of the repeated use of the transfer mask. The present inventors have found out that such a line width change degrades the CD accuracy of the transfer mask and finally degrades the CD accuracy of a pattern-transferred wafer, thus hindering a further increase in the transfer mask lifetime.

Further, the present inventors have elucidated that, in the case of a halftone phase shift mask, a phenomenon occurs in which the width of a transfer pattern of a halftone phase shift film changes (increases) and further the transmittance and the phase shift amount change due to irradiation of ArF excimer laser (wavelength 193 nm) as an exposure light source. In the case of the halftone phase shift mask, such changes in transmittance and phase shift amount are serious problems that affect the transfer mask performance. If the change in transmittance becomes large, the transfer accuracy is degraded, while if the change in phase shift amount becomes large, the phase shift effect at the pattern boundaries is difficult to obtain. As a result, the contrast at the pattern boundaries is lowered and thus the resolution is significantly reduced.

Conventionally, in order to improve the light resistance of a light-semitransmitting film (halftone phase shift film), there already exists a technique in which a light-semitransmitting film composed mainly of a transition metal and silicon is heat-treated in the atmosphere or in an oxygen atmosphere at 250 to 350° C. for 90 to 150 minutes (Patent Document 2). However, as a result of studies by the present inventors, it has been made clear that it is insufficient only with this technique.

It is therefore an object of this invention to provide a transfer mask that can solve the above-mentioned problems, and a method of manufacturing the transfer mask.

It is another object of this invention to provide a method of manufacturing a semiconductor device using this transfer mask.

Means for Solving the Problem

Various aspects (hereinafter referred to as "constitutions") of this invention will be listed.
(Constitution 1)
A transfer mask having a transfer pattern formed in a pattern-forming thin film which is provided on a transparent substrate, wherein the transfer mask is adapted to be applied with exposure light having a wavelength of 200 nm or less,
the pattern-forming thin film is made of a material containing silicon and a transition metal other than chromium, and
a chromium content in the pattern-forming thin film is less than $1.0 \times 10^{18}$ atoms/cm$^3$.
(Constitution 2)
The transfer mask according to constitution 1, wherein the transition metal in the pattern-forming thin film is molybdenum.
(Constitution 3)
The transfer mask according to constitution 1 or 2, wherein the pattern-forming thin film is a light-shielding film having an optical density of 2.5 or more.
(Constitution 4)
The transfer mask according to constitution 3, wherein the pattern-forming thin film is the light-shielding film having a laminated constitution of at least two or more layers comprising a light-shielding layer and a front-surface antireflection layer from the transparent substrate side.
(Constitution 5)
The transfer mask according to any of constitutions 1 to 4, wherein the pattern-forming thin film has the transfer pattern following a DRAM hp45 nm generation.
(Constitution 6)
The transfer mask according to constitution 1 or 2, wherein the pattern-forming thin film is a halftone phase shift film.
(Constitution 7)
A method of manufacturing a transfer mask using a mask blank in which a pattern-forming thin film made of a material containing silicon and a transition metal other than chromium and a chromium-based thin film made of a material containing chromium are laminated in this order on a transparent substrate,
wherein the transfer mask is adapted to be applied with exposure light having a wavelength of 200 nm or less,
wherein the method produces the transfer mask by carrying out in the following order:
a step of forming a resist film having a transfer pattern on the chromium-based thin film;
a step of forming a transfer pattern in the chromium-based thin film using the resist film having the transfer pattern as a mask;
a step of forming a transfer pattern in the pattern-forming thin film using the chromium-based thin film having the transfer pattern as a mask; and
a step of removing the chromium-based thin film by etching, and
wherein the method further comprises a cleaning step of carrying out one or more of alkaline solution cleaning, hot water cleaning, and ozone-containing water cleaning on the produced transfer mask until a chromium content in the transfer pattern of the pattern-forming thin film becomes less than $1.0 \times 10^{18}$ atoms/cm$^3$.
(Constitution 8)
The method of manufacturing a transfer mask according to constitution 7, wherein the cleaning step carries out the alkaline solution cleaning, the hot water cleaning, and the ozone-containing water cleaning in this order.
(Constitution 9)
The method of manufacturing a transfer mask according to constitution 7 or 8, wherein the alkaline solution is an aqueous solution containing ammonia and hydrogen peroxide.
(Constitution 10)
The method of manufacturing a transfer mask according to any of constitutions 7 to 9, wherein the transition metal in the pattern-forming thin film is molybdenum.

(Constitution 11)

The method of manufacturing a transfer mask according to any of constitutions 7 to 9, wherein the pattern-forming thin film is a light-shielding film having an optical density of 2.5 or more, and the chromium-based thin film is entirely removed in the step of removing by etching.

(Constitution 12)

The method of manufacturing a transfer mask according to constitution 11, wherein the pattern-forming thin film is the light-shielding film having a laminated constitution of at least two or more layers comprising a light-shielding layer and a front-surface antireflection layer from the transparent substrate side.

(Constitution 13)

The method of manufacturing a transfer mask according to any of constitutions 7 to 12, wherein the pattern-forming thin film has the transfer pattern following a DRAM hp45 nm generation.

(Constitution 14)

The method of manufacturing a transfer mask according to any of constitutions 7 to 10, wherein the pattern-forming thin film is a halftone phase shift film, a laminated constitution of the chromium-based thin film and the pattern-forming thin film has an optical density of 2.5 or more, and the chromium-based thin film is removed in its region other than a light-shielding band region around a transfer pattern region in the step of removing the chromium-based thin film by etching, thereby forming a light-shielding band.

(Constitution 15)

A method of manufacturing a semiconductor device, comprising forming a circuit pattern on a semiconductor wafer using the transfer mask according to any of constitutions 1 to 6.

(Constitution 16)

A method of manufacturing a semiconductor device, comprising forming a circuit pattern on a semiconductor wafer using the transfer mask manufactured by the method of manufacturing a transfer mask according to any of constitutions 7 to 14.

(Constitution 17)

The method of manufacturing a semiconductor device according to constitution 15 or 16, wherein the circuit pattern formed on the semiconductor wafer includes a circuit pattern following a DRAM hp45 nm generation.

Effect of the Invention

According to Constitution 1, it is possible to provide a transfer mask that can significantly reduce (to ¼ or less or ½ or less) the amount of CD variation in the transfer pattern width of a pattern-forming thin film even if ArF excimer laser which is light having a wavelength of 200 nm or less is irradiated up to a total dose of 40 kJ/cm$^2$.

According to Constitution 7, it is possible to provide a transfer mask manufacturing method that can improve the light resistance of a transfer mask when exposure light having a wavelength of 200 nm or less is cumulatively irradiated beyond the conventional period of time of the repeated use of the transfer mask, thereby improving the lifetime of the transfer mask.

According to Constitution 15, it is possible to provide a semiconductor device manufacturing method using this transfer mask.

MODE FOR CARRYING OUT THE INVENTION

Hereinbelow, this invention will be described in detail with reference to an embodiment.

The present inventors have assumed a cause of the degradation of the transfer mask due to its repeated use becoming notable following the reduction in exposure light source wavelength, as follows.

Figure 4:
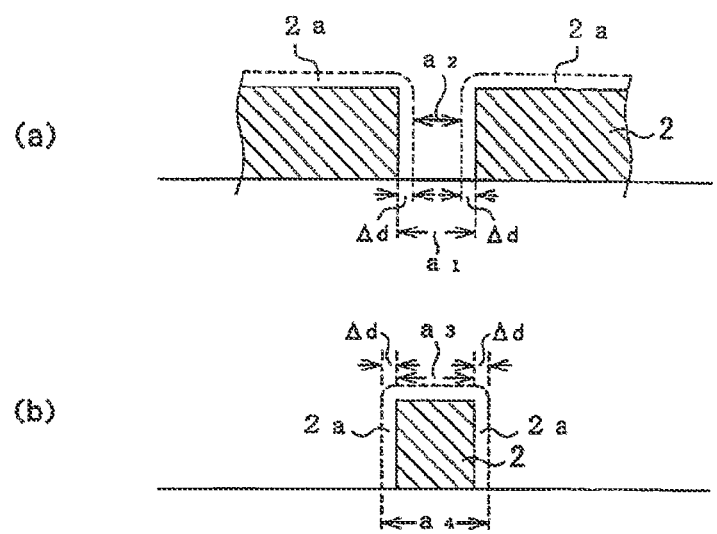
FIG. 4 is exemplary diagrams each for explaining a CD variation in the width of a transfer pattern due to a modified layer.

The present inventors examined a pattern of a pattern-forming thin film, containing a transition metal and silicon, of a transfer mask subjected to a variation in transfer pattern width (CD variation) due to its repeated use. As a result, as shown in FIG. 4, a modified layer 2a containing Si, O, and a little metal (e.g. Mo) was formed on the surface layer side of a thin film 2 containing a transition metal and silicon (transition metal silicide-based film, e.g. MoSi-based film). Then, the present inventors have elucidated that this is one main cause of a transfer pattern width variation (increase) Δd and changes in transmittance and phase shift amount.

The reason (mechanism) for the formation of such a modified layer is considered as follows. That is, the conventional sputtered transition metal silicide-based thin film 2 structurally has gaps and, even if annealing is carried out after the film formation, the change in the structure of the transition metal silicide-based thin film 2 is small. Therefore, for example, oxygen ($O_2$), water ($H_2O$), and the like in the atmosphere and, further, ozone ($O_3$) and the like produced by reaction of oxygen ($O_2$) in the atmosphere with ArF excimer laser enter the gaps and react with Si and transition metal M (e.g. Mo) forming the transition metal silicide-based thin film 2 in the course of using the transfer mask.

That is, when Si and transition metal M forming the transition metal silicide-based thin film 2 are subjected to irradiation of exposure light (particularly short-wavelength light such as ArF) in such an environment, they are excited into a transition state. Then, Si is oxidized and expanded (because $SiO_2$ is greater in volume than Si) and transition metal M is also oxidized so that the modified layer 2a is formed on the surface layer side of the transition metal silicide-based thin film 2. In this event, the quality of a Si oxide film formed largely differs depending on the amount of water (humidity) in the atmosphere and, as the humidity increases, the Si oxide film with a lower density is formed. In the case where the transfer mask is repeatedly used in the environment where the low-density Si oxide film is formed, while being cumulatively subjected to the irradiation of the exposure light, the oxidation and expansion of Si further proceed and transition metal M oxidized at the interface between a non-modified layer and the modified layer 2a in the transition metal silicide-based thin film 2 diffuses in the modified layer to be deposited on a surface thereof and sublimated as, for example, an oxide of transition metal M (e.g. $MoO_3$). Accordingly, the modified layer 2a is further reduced in density and thus is in a state where it is easily oxidized. As a result, it is considered that the thickness of the modified layer 2a gradually increases (the occupation ratio of the modified layer 2a in the transition metal silicide-based thin film 2 increases).

This phenomenon of the formation and enlargement of the modified layer 2a is significantly observed in the case where exposure light with a wavelength of 200 nm or less, such as ArF excimer laser, having energy necessary for exciting Si and transition metal M forming the transition metal silicide-based thin film 2 into a transition state, which triggers oxidation reactions of these constituent atoms, is irradiated for a long time.

By the mechanism described above, the transition metal silicide-based pattern-forming thin film is subjected to the occurrence of a variation in transfer pattern width (CD increase) which is considered to be caused by the oxidation of silicon (Si) in the film.

The present inventors further studied intensively about the cause of the formation of the modified layer of the transition metal silicide-based pattern-forming thin film. As a result, it has been found out that the presence of a thin film of a chromium-based material (etching mask film, light-shielding film for forming a light-shielding band or the like, etc.) laminated on the pattern-forming thin film largely affects the formation of the modified layer. Specifically, first, there were prepared mask blanks respectively having transition metal silicide-based pattern-forming thin films of the same film structure, wherein, however, one of them had a chromium-based thin film laminated on the pattern-forming thin film while the other had no such a film. Then, with respect to the mask blank having the chromium-based thin film, the pattern-forming thin film was dry-etched with a fluorine-based gas using a transfer pattern of the chromium-based thin film as a mask, thereby forming a transfer pattern. Thereafter, the chromium-based thin film was removed by dry etching using a mixed gas of chlorine and oxygen and then a conventional cleaning process was carried out, thereby manufacturing a transfer mask. On the other hand, with respect to the mask blank having no chromium-based thin film, the pattern-forming thin film was dry-etched with a fluorine-based gas using a resist pattern as a mask, thereby forming a transfer pattern. Thereafter, the resist pattern was removed and then a conventional cleaning process was carried out, thereby manufacturing a transfer mask. For these two transfer masks, ArF exposure light was irradiated for a long time under the same conditions (cumulative dose: 40 kJ/cm$^2$, pulse frequency: 300 Hz) to carry out verification. As a result, the amount of variation in the transfer pattern width (amount of CD variation) of the transfer mask manufactured from the mask blank having no chromium-based thin film was about 1 nm, which was not problematic for continuous use. In contrast, the amount of variation in the transfer pattern width (amount of CD variation) of the transfer mask manufactured from the mask blank having the chromium-based thin film was 15.9 nm, which was considerably problematic for continuous use.

Figure 2:
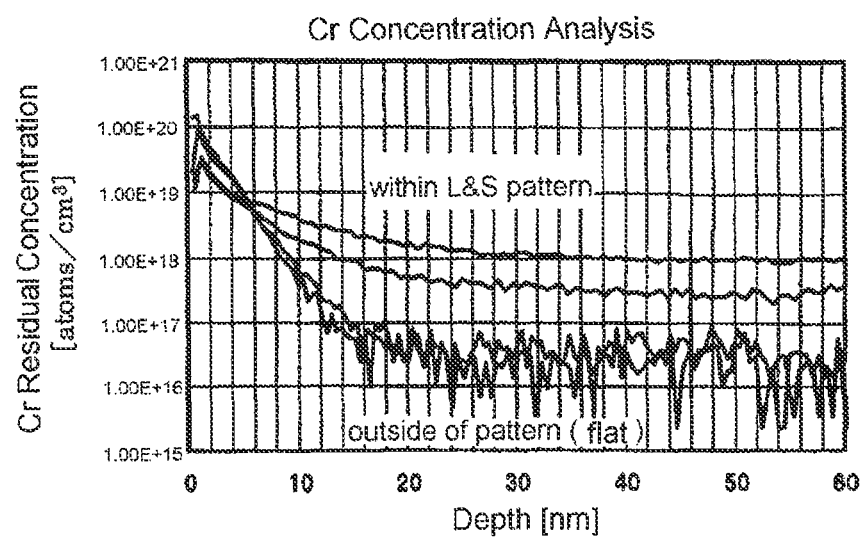
FIG. 2 is a diagram showing the results of analyzing the chromium concentration by D-SIMS.

A transfer mask of the type that was subjected to the large amount of variation in pattern width was manufactured again under the same conditions. Then, using secondary ion mass spectrometry (SIMS) without carrying out irradiation of ArF exposure light, a substance which was not contained in the composition at the time of the formation of the pattern-forming thin film, i.e. a residual substance that adhered (remained) in the manufacture of the transfer mask, was examined in a dynamic mode (D-SIMS) adapted to measure a sample while shaving it. As a result, the residual concentration of chromium and chlorine in the pattern-forming thin film was found to be high. Further, in order to examine where and how the residual substance was present, the residual substance concentration was examined in the dynamic mode (D-SIMS) in a non-pattern region (so-called "flat" region, i.e. region where no sidewall portion of the transfer pattern was present) and in a region including lines and spaces (region where a sidewall portion of the transfer pattern was present). As a result, in the non-pattern region (so-called "flat" region), the residual substance concentration was high in a surface layer and then sharply decreased in the depth direction. From this, the residual substance (Cr) was found to be present in the surface layer (see FIG. 2). In the region including lines and spaces, the residual substance concentration was likewise high in a surface layer. However, since the residual substance concentration did not decrease so much in the depth direction after the surface layer was shaved, the residual substance (Cr) was found to be also present at high concentration at the sidewall portion of the pattern (see FIG. 2). In the D-SIMS of FIG. 2, $O_2$ was used as primary ions.

Figure 3:
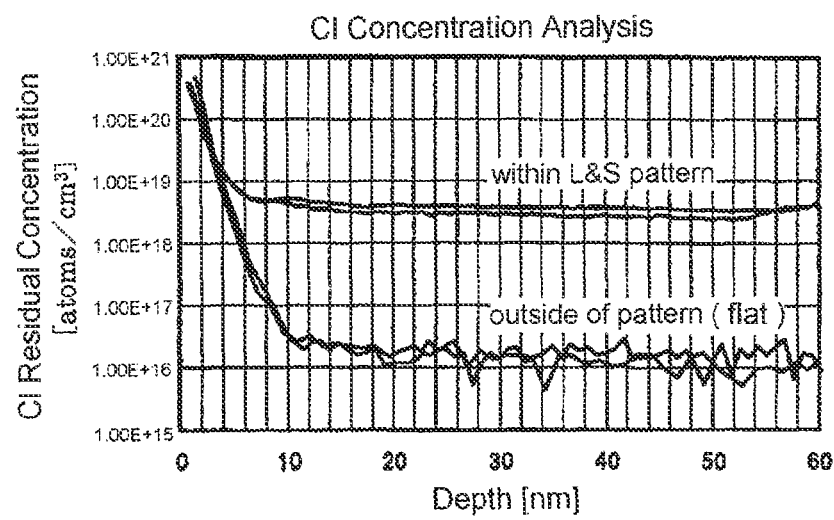
FIG. 3 is a diagram showing the results of analyzing the chlorine concentration by D-SIMS.

FIG. 3 shows the results of measuring the residual concentration of chlorine by the D-SIMS as in the case of chromium. In the D-SIMS of FIG. 3, Cs was used as primary ions. In order to confirm the influence of the residual concentration of chlorine on a modified layer, the dry etching time for removing the chromium-based thin film was prolonged to intentionally increase the chlorine residual concentration of the transfer pattern sidewall and then irradiation of ArF exposure light was carried out under the same conditions. As a result, no particular correlation was observed with respect to the width of the modified layer (amount of CD variation).

From these D-SIMS results and so on, it has been found out that the residual substance concentration of Cr is high at the transfer pattern sidewall portion to which Cr could not adhere in the manufacture of the mask blank, and at those portions, other than the surface layer which was in contact with the chromium-based thin film, of the pattern-forming thin film. This is considered to be because, in the removal of the chromium-based thin film after forming the transfer pattern by dry-etching the pattern-forming thin film using the transfer pattern of the chromium-based thin film as a mask, chromium sublimated by the dry etching with the mixed gas of chlorine and oxygen adhered again to the transfer pattern sidewall of the pattern-forming thin film and entered gaps of the transition metal and silicon structure or was bonded to silicon so that it was not possible to remove chromium by the conventional cleaning process.

When this manufactured transfer mask is irradiated with ArF exposure light, like the transition metal as the material of the pattern-forming thin film, the remaining chromium is also excited into a transition state by the ArF exposure light and reacts with the remaining chlorine, oxygen in the atmosphere, and ozone produced by reaction with the ArF exposure light so as to be sublimated. Since not only the transition metal of the film material, but also chromium are sublimated to escape from the pattern sidewall portion, more gaps are formed in the modified layer so that the transition metal is easily sublimated from the interface between the non-modified layer and the modified layer in the pattern-forming thin film. The present inventors have elucidated that, with this mechanism, the growth of the modified layer is enhanced if much chromium remains at the pattern sidewall portion. Then, based on the elucidated fact and consideration, the present inventors have paid attention to the chromium residue thus produced at the transfer pattern sidewall portion of the pattern-forming thin film for the purpose of suppressing the formation and enlargement of the modified layer. As a result of further intensive studies, the present inventors have completed this invention.

A transfer mask according to the embodiment of this invention is a transfer mask having a transfer pattern formed in a pattern-forming thin film which is provided on a transparent substrate, wherein the transfer mask is adapted to be applied with exposure light having a wavelength of 200 nm or less, the pattern-forming thin film is made of a material containing a transition metal other than chromium and silicon, and the chromium content in the pattern-forming thin film is less than $1.0 \times 10^{18}$ atoms/cm$^3$ (corresponding to Structure 1).

Herein, the pattern-forming thin film may have a transfer pattern following the DRAM hp45 nm generation (corresponding to Structure 5).

As described above, the present inventors have obtained the new knowledge that the chromium residue at a transfer pattern sidewall portion of a transfer-pattern thin film largely affects the growth of a modified layer. Only in terms of preventing adhesion of the chromium residue to (reducing the residual chromium concentration at) a transfer pattern sidewall portion of a transfer-pattern thin film containing a transition metal other than chromium and silicon, it is the best way not to employ a mask blank structure which requires a transfer pattern to be formed in a transfer-pattern thin film using a chromium-based thin film as a mask (etching mask). However, as described before, under the current circumstances where the transfer pattern miniaturization has advanced, it is difficult to accurately form a transfer pattern in a pattern-forming thin film using a resist pattern as a mask particularly in the case of a binary transfer mask following the DRAM hp45 nm generation, particularly following the hp32 nm generation.

In the case of a binary transfer mask of the DRAM hp45 nm generation, the width of a fine assist pattern (SRAF: Sub-Resolution Assist Feature) is as narrow as about 60 nm and, in order to prevent collapse/stripping of a resist pattern, the thickness of a resist film should be set to 150 nm or less. With this thickness, it is difficult to form a transfer pattern in a transfer-pattern thin film without using an etching mask film. Further, in the case of a binary transfer mask of the DRAM hp32 nm generation, the width of SRAF is as extremely narrow as about 40 nm and thus the thickness of a resist film should be set to 100 nm or less. With this thickness, it is far difficult to form a transfer pattern in a transfer-pattern thin film without using an etching mask film.

On the other hand, in the case of a phase shift mask, a light-shielding film should be laminated in order to form a light-shielding band or the like on a pattern-forming thin film containing a transition metal other than chromium and silicon. It may be considered to employ a method of using a material other than chromium for the etching mask film or the light-shielding film. However, other than a chromium-based material, it is difficult to find a highly reliable material that can surely satisfy those conditions such as having high etching selectivity to the pattern-forming thin film containing the transition metal other than chromium and silicon and exerting only a small influence on the pattern-forming thin film at the time of its removal by etching.

Figure 1:
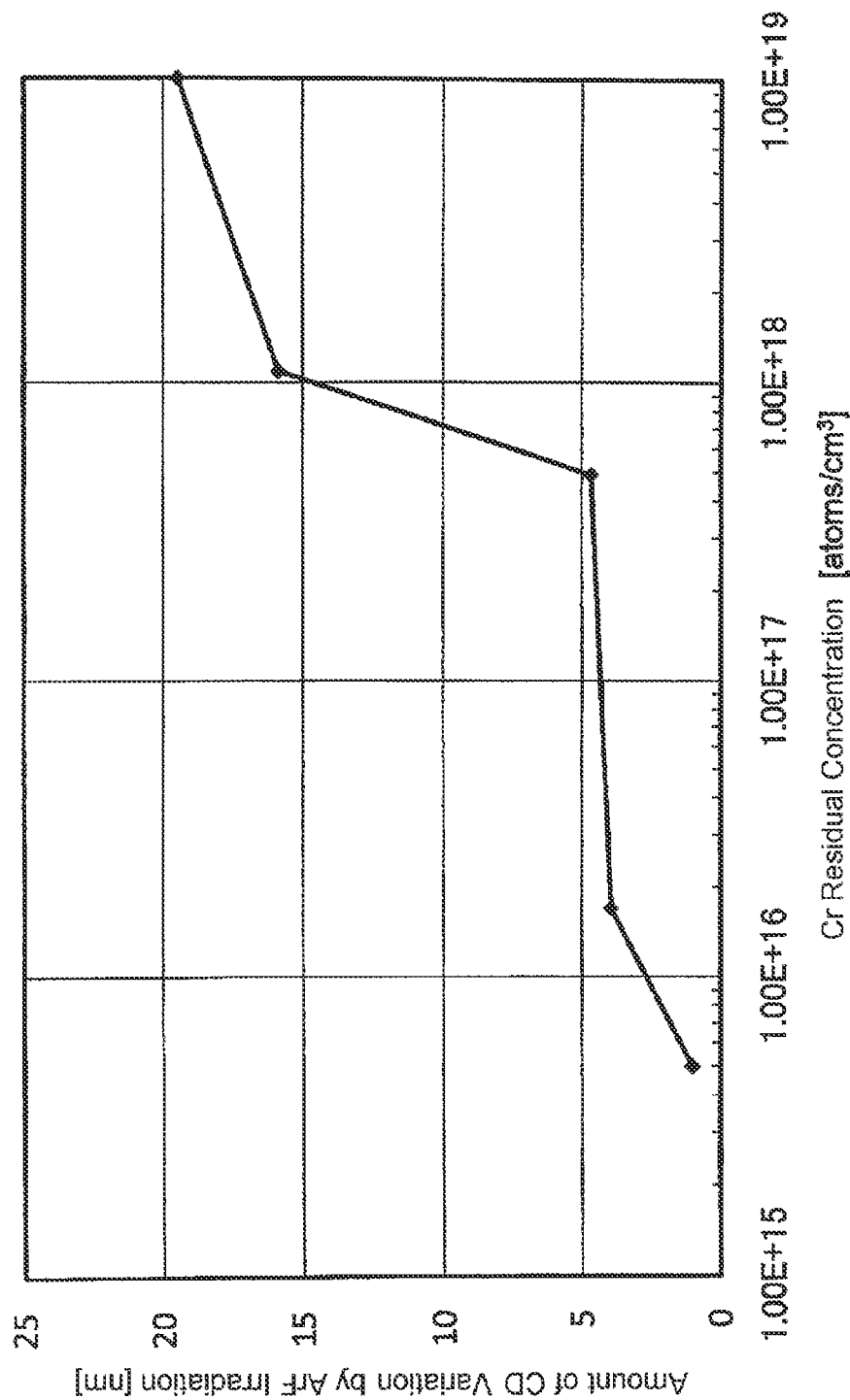
FIG. 1 is a diagram showing the relationship between the residual Cr concentration (atoms/cm$^3$) and the amount of CD variation (nm) due to ArF excimer laser irradiation.

In the case of manufacturing a transfer mask from a mask blank having a structure in which a chromium-based thin film is formed on a pattern-forming thin film containing a transition metal other than chromium and silicon, the present inventors have examined to what degree the content of chromium adhering to the pattern-forming thin film in manufacturing processes should be reduced by a cleaning process or the like for suppressing the amount of CD variation to a non-problematic value even if ArF exposure light is irradiated for a long time (total dose 40 kJ/cm$^2$). In the DRAM hp32 nm generation, the CD control should be 2.6 nm or less on a wafer. Taking this point into account, the amount of CD variation required for the transfer mask is preferably 5 nm or less. As a result of various verifications, it has been found out that, as shown in FIG. 1, if the chromium content (residual Cr concentration) in the transfer-pattern thin film is less than $1.0 \times 10^{18}$ atoms/cm$^3$, the amount of CD variation can be suppressed to 5 nm or less which is required. Further, it has been found out that the amount of CD variation due to ArF exposure light irradiation can be suppressed more reliably by reducing the chromium content in the transfer-pattern thin film to $5.0 \times 10^{17}$ atoms/cm$^3$ or less.

In the above-mentioned transfer mask, the pattern-forming thin film is a thin film for forming a transfer pattern (mask pattern), is formed of a material containing a transition metal (except chromium) and silicon, and is intended to be substantially free of chromium. For example, when the pattern-forming thin film is formed on a transparent substrate by a sputtering method, use is made of a sputtering target containing no chromium and use is made of a film forming gas which also contains no chromium.

Therefore, the chromium content in the pattern-forming thin film other than in a surface layer (a surface that was in contact with the chromium-based thin film, and a sidewall portion) of the transfer pattern of the pattern-forming thin film is at a level of $1.0 \times 10^{16}$ atoms/cm$^3$ or less (level that is determined to be substantially free of chromium).

With respect to the transfer pattern of the pattern-forming thin film, the chromium content of its surface layer should be less than $1.0 \times 10^{18}$ atoms/cm$^3$. Particularly, the sidewall portion is a portion which is exposed at the time of stripping the Cr-based thin film in the manufacture of the transfer mask and which is directly subjected to ArF exposure light irradiation and is in contact with the atmosphere, and therefore, the conditions for the formation of a modified layer are best provided. An effect by reducing the chromium content to less than $1.0 \times 10^{18}$ atoms/cm$^3$ remarkably appears at the sidewall portion.

As shown in FIG. 4, assuming that the thickness of a modified layer 2a formed in a surface layer of a transfer pattern 2 is $\Delta d$, the amount of CD variation in the width of the transfer pattern of the pattern-forming thin film in the transfer mask is defined as $2\Delta d$.

FIG. 4(a) shows the case of a space shape such as an isolated space or a hole, wherein the amount of CD variation=a1−a2=2Δd.

FIG. 4(b) shows the case of a pattern shape such as an isolated line or a dot, wherein the amount of CD variation=a4−a3=2Δd.

In the case of a line and space pattern, it may be defined by either of them.

In the above-mentioned transfer mask, as the transition metal (M) in the pattern-forming thin film made of the material containing the transition metal other than chromium and silicon, there can be cited, for example, one of molybdenum (Mo), tantalum (Ta), tungsten (W), titanium (Ti), zirconium (Zr), vanadium (V), niobium (Nb), nickel (Ni), palladium (Pb), ruthenium (Ru), rhodium (Rh), and hafnium (Hf), or an alloy thereof.

In the above-mentioned transfer mask, the material forming the pattern-forming thin film may be a material containing nitrogen, oxygen, carbon, hydrogen, an inert gas (helium, argon, xenon, or the like), or the like in addition to the transition metal and silicon.

In the above-mentioned transfer mask, the pattern-forming thin film may be a light-shielding film in a binary mask or a halftone phase shift film. The pattern-forming thin film is a thin film that transmits exposure light at such a predetermined transmittance that a resist film of a transfer target to which a pattern is transferred is not sensitized, but may alternatively be a light-semitransmitting film that is adjusted so as not to provide a phase difference between exposure light transmitted through the thin film and exposure light transmitted through a portion having no thin film. A mask blank to which this type of light-semitransmitting film is applied is often used for manufacturing an enhancer mask. Since this light-semitransmitting film has a predetermined transmittance for exposure light, if overlay exposure is carried out at the time of exposure to a resist film of a transfer target in an exposure apparatus, the resist film may be sensitized. Accordingly, a film structure is often employed in which a light-shielding film for forming a light-shielding band is laminated on the light-semitransmitting film.

In the above-mentioned transfer mask, the transition metal in the pattern-forming thin film may be molybdenum (corresponding to Structure 2). In this case, since molybdenum is easily bonded to oxygen or ozone to become ($MoO_3$) and $MoO_3$ is a vaporizable substance, it functions particularly effectively to suppress modification of the pattern sidewall portion.

In the above-mentioned transfer mask, the pattern-forming thin film may be a light-shielding film having an optical density of 2.5 or more (corresponding to Structure 3). In the case of a binary mask, the optical density of a light-shielding film in a pattern transfer region should be at least 2.5 or more in order to cope with single exposure. Therefore, Structure 3 is effective. Higher light-shielding performance is required for the light-shielding film depending on the structure of an exposure apparatus, the sensitivity characteristics of a resist film or the like on a wafer to which a transfer pattern is transferred, or the like. Therefore, the optical density is more preferably 2.8 or more and, if it is 3.0 or more, it is possible to cope with various mask using environments.

In the above-mentioned transfer mask, the pattern-forming thin film may be a light-shielding film having a laminated structure of at least two or more layers comprising a light-shielding layer and a front-surface antireflection layer from the transparent substrate side (corresponding to Structure 4).

In the case where the light-shielding film has the two-layer laminated structure of the light-shielding layer and the front-surface antireflection layer, the light-shielding layer should have a function of preventing back-surface reflection (reflection of exposure light at the interface between the transparent substrate and the light-shielding layer).

Further, the light-shielding film may have a three-layer laminated structure in which a back-surface antireflection layer is further provided on the transparent substrate side of the light-shielding layer. In this case, since the back-surface antireflection layer has a back-surface antireflection function, film design of the light-shielding layer can be made while attaching importance to ensuring the optical density. The light-shielding film may be a single-layer composition gradient film. The front-surface antireflection film, the light-shielding layer, and the back-surface antireflection film each may also be a composition gradient film.

In the above-mentioned transfer mask, the pattern-forming thin film may be a halftone phase shift film (corresponding to Structure 6).

In the above-mentioned transfer mask, the halftone phase shift film (light-semitransmitting film) may have a single-layer structure, a two-layer structure comprising a low-transmittance layer and a high-transmittance layer, or a multilayer structure.

The halftone phase shift film may be of the high-transmittance type. The high-transmittance type has, for example, a relatively high transmittance of 10 to 30% while the transmittance is normally 1% to less than 10%.

A transfer mask manufacturing method according to the embodiment of this invention is a method of manufacturing a transfer mask using a mask blank in which a pattern-forming thin film made of a material containing a transition metal other than chromium and silicon and a chromium-based thin film made of a material containing chromium are laminated in this order on a transparent substrate, wherein the transfer mask is adapted to be applied with exposure light having a wavelength of 200 nm or less, wherein the method produces the transfer mask by carrying out in the following order: a process of forming a resist film having a transfer pattern on the chromium-based thin film; a process of forming a transfer pattern in the chromium-based thin film using the resist film having the transfer pattern as a mask; a process of forming a transfer pattern in the pattern-forming thin film using the chromium-based thin film having the transfer pattern as a mask; and a process of removing the chromium-based thin film by etching, and wherein the method further comprises a cleaning process of carrying out one or more of alkaline solution cleaning, hot water cleaning, and ozone-containing water cleaning on the produced transfer mask until a chromium content in the transfer pattern of the pattern-forming thin film becomes less than $1.0 \times 10^{18}$ atoms/$cm^3$ (corresponding to Structure 7).

In the above-mentioned transfer mask manufacturing method, the pattern-forming thin film may have a transfer pattern following the DRAM hp45 nm generation (corresponding to Structure 13).

The present inventors have considered that it is not easy to reduce the residual chromium concentration of a pattern sidewall portion by the conventional cleaning process and, as a result, have reached a conclusion that it is possible to suppress the growth of a modified layer by dissolving and removing the pattern sidewall portion itself, where the residual chromium concentration is high, by a specific cleaning process.

Assuming that a pattern-forming thin film (e.g. MoSi-based binary film) is patterned by dry etching with a mixed gas of $SF_6$ and He using a Cr-based film pattern as a mask and then that the Cr-based film pattern used as the etching mask is stripped and removed by dry etching (with plasma of chlorine and oxygen), the present inventors have elucidated that initial cleaning after the removal of the Cr-based film pattern largely affects the ArF irradiation resistance and thus is important.

The present inventors have found out that if the initial cleaning is not appropriate, there is a tendency of no improvement even if various kinds of cleaning are carried out in a subsequent process. For example, if the initial cleaning is acid cleaning with a sulfuric acid-hydrogen peroxide mixture, hot concentrated sulfuric acid, or the like, there is a tendency of no improvement even if various kinds of cleaning are carried out in a subsequent process.

The present inventors have found out that a cleaning process of carrying out one or more of alkaline solution cleaning, hot water cleaning, and ozone-containing water cleaning is suitable as the initial cleaning. The present inventors have found out that this cleaning process can dissolve the above-mentioned pattern sidewall portion where the residual chromium concentration is high, and can remove the dissolved chromium without allowing the dissolved chromium to re-enter the inside of the transfer pattern so that the residual chromium concentration of the pattern-forming thin film can be reduced to less than $1.0 \times 10^{18}$ atoms/$cm^3$. Further, unlike the above-mentioned acid cleaning process, this cleaning process does not show such a tendency that there is no improvement even if various kinds of cleaning are carried out in a subsequent process.

The present inventors have found out that if the cleaning process of carrying out one or more of alkaline solution cleaning, hot water cleaning, and ozone-containing water cleaning is applied to the initial cleaning, the residual chromium concentration (chromium content) of the pattern-forming thin film can be reduced to less than $1.0 \times 10^{18}$ atoms/cm$^3$. Further, by adjusting the order and time of alkaline solution cleaning, hot water cleaning, and ozone-containing water cleaning, it is possible to reduce the chromium content in the pattern-forming thin film to $5.0 \times 10^{17}$ atoms/cm$^3$ or less and thus to suppress the amount of CD variation due to ArF exposure light irradiation more reliably.

As a result of various verifications, the present inventors have found out that the residual chromium concentration (chromium content) of the pattern-forming thin film can be reduced to less than $1.0 \times 10^{18}$ atoms/cm$^3$ by carrying out the cleaning process until the width of the transfer pattern of the transfer-pattern thin film is reduced to 4 nm or until the space width of the transfer pattern is increased to 4 nm.

The process of cleaning with alkaline solution preferably uses an alkaline solution such as an aqueous solution containing ammonia and hydrogen peroxide.

The temperature of the alkaline solution is preferably about 15 to 80° C.

The treatment time with the alkaline solution is preferably about 10 to 20 minutes.

The process of cleaning with hot water preferably uses pure water or ultrapure water such as ion-exchanged water (DI water: deionized water).

The temperature of the hot water is preferably about 70 to 90° C.

The treatment time with the hot water is preferably about 10 to 20 minutes.

The process of cleaning with ozone-containing water preferably uses 40 to 60 ppm ozone-containing water.

The temperature of the ozone-containing water is preferably about 15 to 30° C.

The treatment time with the ozone-containing water is preferably about 10 to 20 minutes.

In the above-mentioned transfer mask manufacturing method, the cleaning process preferably carries out the alkaline solution cleaning, the hot water cleaning, and the ozone-containing water cleaning in this order (corresponding to Structure 8).

The present inventors have found out that if the cleaning process carries out the alkaline solution cleaning, the hot water cleaning, and the ozone-containing water cleaning in this order, the chromium content of the pattern-forming thin film can be efficiently reduced to less than $1.0 \times 10^{18}$ atoms/cm$^3$ and further to $5.0 \times 10^{17}$ atoms/cm$^3$ or less.

In the above-mentioned transfer mask manufacturing method, the alkaline solution is preferably an aqueous solution containing ammonia and hydrogen peroxide (corresponding to Structure 9).

The present inventors have found out that if the alkaline solution is an aqueous solution containing ammonia and hydrogen peroxide, the Cr residue can be reduced very efficiently and reliably.

As the aqueous solution containing ammonia and hydrogen peroxide, it is preferable to use, for example, a solution of ammonium hydroxide (NH$_4$OH concentration 25 wt %): hydrogen peroxide (H$_2$O$_2$ concentration 30 wt %): water (H$_2$O)=2:1:4 (volume ratio).

In the above-mentioned transfer mask manufacturing method, the transition metal in the pattern-forming thin film may be molybdenum (corresponding to Structure 10). In this case, since molybdenum is easily bonded to oxygen or ozone to become (MoO$_3$) and MoO$_3$ is a vaporizable substance, it functions particularly effectively to suppress modification of the pattern sidewall portion.

In the above-mentioned transfer mask manufacturing method, the pattern-forming thin film may be a light-shielding film having an optical density of 2.5 or more and the chromium-based thin film may be entirely removed in the process of removing by etching (corresponding to Structure 11). In this case, the chromium-based thin film is used as an etching mask and is entirely removed after the use and this transfer mask is used as a binary mask.

In the case of the binary mask, the optical density of the light-shielding film in a pattern transfer region should be at least 2.5 or more in order to cope with double exposure. This requirement can be satisfied according to Structure 11. Higher light-shielding performance is required for the light-shielding film depending on the structure of an exposure apparatus, the sensitivity characteristics of a resist film or the like on a wafer to which a transfer pattern is transferred, or the like. Therefore, the optical density is more preferably 2.8 or more and, if it is 3.0 or more, it is possible to cope with various mask using environments.

When the transfer mask is placed on a mask stage of an exposure apparatus to expose the transfer pattern to a resist film or the like on a wafer using ArF exposure light, the ArF exposure light is irradiated to the transparent substrate side to transmit through a space portion, having no pattern-forming thin film, in a region where the transfer pattern is formed, so as to be incident on a reduction optical system. Therefore, in the case of the binary mask, which requires no light-shielding patch or the like to be provided, the chromium-based thin film is preferably removed at least in the region where the transfer pattern is formed, and is most preferably removed from the entire surface of the pattern-forming thin film.

In the above-mentioned transfer mask manufacturing method, the pattern-forming thin film may be a light-shielding film having a laminated structure of at least two or more layers comprising a light-shielding layer and a front-surface antireflection layer from the transparent substrate side (Structure 12).

In the above-mentioned transfer mask manufacturing method, the pattern-forming thin film may be a halftone phase shift film, a laminated structure of the chromium-based thin film and the pattern-forming thin film may have an optical density of 2.5 or more, and the chromium-based thin film may be removed in its region other than a light-shielding band region around a transfer pattern region in the process of removing the chromium-based thin film by etching, thereby forming a light-shielding band (corresponding to Structure 14). In this case, the chromium-based thin film has a function of providing light-shielding capability (optical density) in the light-shielding band region, in addition to a function of an etching mask.

In the case of the halftone phase shift mask, the optical density of the light-shielding band region should be at least 2.5 or more. This requirement can be satisfied according to Structure 14. On the halftone phase shift film in the transfer pattern region, the chromium-based thin film may be left at a portion with a large film pattern which requires a light-shielding patch.

In the above-mentioned transfer mask, a material with very high light-shielding capability is preferable as the light-shielding layer of the light-shielding film and thus it is preferably made of a material with light-shielding capability higher than that of chromium. A material containing a transition metal and silicon has higher light-shielding capability than chromium.

The optical density of a material containing molybdenum as a transition metal and silicon tends to reach the ceiling when a ratio, given in percent, obtained by dividing the molybdenum content [at %] by the molybdenum and silicon total content [at %] (hereinafter referred to as a (Mo/Mo+Si) ratio) reaches a certain value. The (Mo/Mo+Si) ratio, at which the optical density reaches the ceiling, somewhat changes depending on the content of other elements (nitrogen etc.) in the material, but does not exceed 40%. The material containing molybdenum and silicon has a problem that when the molybdenum content is high, the chemical resistance and cleaning resistance (particularly to alkaline cleaning or hot water cleaning) decrease. Taking these into account, it is preferable to set an upper limit of the (Mo/Mo+Si) ratio, applicable to a light-shielding layer containing molybdenum and silicon, to 40% which can ensure the required minimum chemical resistance and cleaning resistance when used as a transfer mask.

On the other hand, the lower limit of the (Mo/Mo+Si) ratio differs between a light-shielding film of a two-layer laminated structure and a light-shielding film of a three-layer laminated structure because the optical density changes depending on the content of other elements in a light-shielding layer.

In the case of a light-shielding film of a three-layer laminated structure comprising a back-surface antireflection layer, a light-shielding layer, and a front-surface antireflection layer, the light-shielding layer is not required to have either a back-surface antireflection function or a front-surface antireflection function and thus does not need to substantially contain oxygen or nitrogen. In this case, even if the lower limit of the (Mo/Mo+Si) ratio is 9%, the light-shielding film can sufficiently ensure an optical density of 2.5 or more with a small film thickness (60 nm or less).

On the other hand, in the case of a light-shielding film of a two-layer laminated structure comprising a light-shielding layer and a front-surface antireflection layer, the light-shielding layer is required to have a back-surface antireflection function and thus should contain nitrogen in a range of 30 at % or less. In this case, the light-shielding film can sufficiently ensure an optical density of 2.5 or more by setting the lower limit of the (Mo/Mo+Si) ratio to 15%.

Even when a transition metal other than molybdenum is used as a material of the light-shielding film, approximately the same tendency is shown. The degree of reduction in light-shielding performance relative to the oxygen content in the light-shielding layer is far greater as compared with the nitrogen content and, therefore, the thickness required for the light-shielding layer becomes greater in proportion to the oxygen content. Since the back-surface reflectance for exposure light can be reduced only with nitrogen, the oxygen content of the light-shielding layer is preferably less than 10 at %, and, more preferably, the light-shielding layer is substantially free of oxygen (oxygen is allowed to be contained to a degree due to contamination or the like).

In the above-mentioned transfer mask, the front-surface antireflection layer of the light-shielding film is preferably composed mainly of a material containing a transition metal, silicon, and at least one or more elements selected from oxygen and nitrogen.

Specifically, the front-surface antireflection layer is preferably made of a material composed mainly of a transition metal (M) and silicon (MSiO, MSiN, MSiON, MSiOC, MSiCN, MSiOCN, or the like). Among them, MSiO or MSiON is preferable in terms of the chemical resistance and the heat resistance while MSiON is preferable in terms of the mask blank defect quality.

In the above-mentioned transfer mask, when MoSiON, MoSiO, MoSiN, MoSiOC, or MoSiOCN is applied to the front-surface antireflection layer, if Mo is increased in amount, the cleaning resistance, particularly the resistance to alkali (aqueous ammonia, etc.) or hot water, decreases. From this point of view, it is preferable to minimize Mo in MoSiON, MoSiO, MoSiN, MoSiOC, MoSiOCN, or the like being the front-surface antireflection layer.

It has been found out that, upon carrying out a heat treatment (annealing) at a high temperature for the purpose of stress control, if the Mo content is high, a phenomenon that a film surface is clouded white (becomes cloudy) occurs. This is considered to be because MoO is precipitated on the surface. In terms of avoiding such a phenomenon, the content of Mo in MoSiON, MoSiO, MoSiN, MoSiOC, MoSiOCN, or the like being the front-surface antireflection layer is preferably less than 10 at %. However, if the Mo content is too low, abnormal discharge becomes significant in DC sputtering so that the defect occurrence frequency increases. Therefore, it is preferable to contain Mo in a range capable of carrying out sputtering normally. According to another film forming technique, there is a case where the film formation is enabled without containing Mo.

It is highly required to ensure 30% or less as a front-surface reflectance of the light-shielding film for ArF exposure light. It is preferably 25% or less. It is most preferable to ensure 20% or less as long as the thickness of the entire light-shielding film is within an allowable range.

In order to suppress the front-surface reflectance to a predetermined value or less, the thickness of the front-surface antireflection layer 12 is preferably greater than 5 nm. In order to achieve a lower reflectance, the thickness is preferably set to 7 nm or more. Further, in consideration of the production stability and the film loss of the front-surface antireflection layer due to repeated mask cleaning after manufacturing the transfer mask, the thickness of the front-surface antireflection layer is preferably 10 nm or more. In terms of reducing the thickness of the entire light-shielding film, the thickness of the front-surface antireflection layer with only a small contribution to the optical density of the light-shielding film is preferably 20 nm or less and more preferably 15 nm or less.

It is highly required to ensure 40% or less as a back-surface reflectance of the light-shielding film for ArF exposure light. It is preferably 35% or less. It is most preferable to ensure 30% or less as long as the thickness of the entire light-shielding film is within an allowable range.

In the case of a light-shielding film of a three-layer laminated structure including a back-surface antireflection layer, in order to suppress the back-surface reflectance to a predetermined value or less, the thickness of the back-surface antireflection layer is preferably greater than 5 nm. In order to achieve a lower reflectance, the thickness is preferably set to 7 nm or more. In terms of reducing the thickness of the entire light-shielding film, the thickness of the back-surface antireflection layer with only a small contribution to the optical density of the light-shielding film is preferably 15 nm or less and more preferably 12 nm or less.

In the above-mentioned transfer mask, as the chromium-based thin film, there can be cited a material such as chromium alone or a material containing chromium and at least one kind of element from among oxygen, nitrogen, carbon, and hydrogen (a film composed mainly of chromium or a material containing Cr).

Among them, the chromium-based thin film is preferably formed of a material composed mainly of any one of chromium nitride, chromium oxide, chromium oxynitride, and chromium carboxynitride. The film structure of the chromium-based thin film may be a single-layer structure or a plural-layer structure made of the above-mentioned film material/materials. The plural-layer structure may be a plural-layer structure having different compositions formed stepwise or a film structure in which the composition changes continuously.

In the above-mentioned transfer mask, the chromium content in the chromium-based thin film may be 45 at % or less. If the chromium content in the film is 45 at % or less, the etching rate of the chromium-based thin film becomes high to thereby enable a reduction in resist film thickness.

The etching rate of a Cr-based material by a chlorine-based gas is improved as oxidation proceeds. Although not comparable with the oxidation, the etching rate of a Cr-based material by a chlorine-based gas is also improved as nitridation proceeds. Therefore, it is preferable to promote oxidation and nitridation.

In terms of providing excellent defect quality of the film, chromium carboxynitride or chromium carboxide is preferable. On the other hand, chromium carboxynitride (CrOCN) is preferable in terms of stress controllability (low-stress film can be formed).

A semiconductor device manufacturing method according to the embodiment of this invention comprises forming a circuit pattern on a semiconductor wafer using the transfer mask according to any of Structures 1 to 6 (corresponding to Structure 15).

In the above-mentioned semiconductor device manufacturing method, a circuit pattern may be formed on a semiconductor wafer using the transfer mask manufactured by the transfer mask manufacturing method according to any of Structures 7 to 14 (corresponding to Structure 16).

In the above-mentioned semiconductor device manufacturing method, the circuit pattern formed on the semiconductor wafer may be a circuit pattern following the DRAM hp45 nm generation (corresponding to Structure 17).

By the use of the above-mentioned transfer mask or the transfer mask manufactured by the above-mentioned transfer mask manufacturing method, a larger number of semiconductor devices having a highly accurate circuit pattern can be continuously manufactured using the same transfer mask as compared with using a conventional transfer mask.

In the above-mentioned transfer mask manufacturing method, it is possible to use, for example, a fluorine-based gas, such as $SF_6$, $CF_4$, $C_2F_6$, or $CHF_3$, or a mixed gas of such a fluorine-based gas and He, $H_2$, $N_2$, Ar, $C_2H_4$, $O_2$, or the like for dry-etching the thin film containing the transition metal and silicon.

In the above-mentioned transfer mask manufacturing method, it is preferable to use a dry etching gas in the form of a mixed gas containing a chlorine-based gas and an oxygen gas for dry-etching the chromium-based thin film. This is because if the chromium-based thin film made of the material containing chromium and the element/elements such as oxygen and nitrogen is dry-etched using the above-mentioned dry etching gas, it is possible to increase the dry etching rate and thus to shorten the dry etching time so that a light-shielding film pattern with an excellent cross-sectional shape can be formed. As the chlorine-based gas for use in the dry etching gas, there can be cited, for example, $Cl_2$, $SiCl_4$, HCl, $CCl_4$, $CHCl_3$, or the like.

In the above-mentioned transfer mask, the resist is preferably a chemically amplified resist. This is because it is suitable for high-accuracy processing.

In the above-mentioned transfer mask, the resist is preferably a resist for electron beam writing. This is because it is suitable for high-accuracy processing.

In the above-mentioned transfer mask, as the substrate, there can be cited a synthetic quartz substrate, a $CaF_2$ substrate, a soda-lime glass substrate, an alkali-free glass substrate, an aluminosilicate glass substrate, or the like.

In the above-mentioned various techniques, the transfer mask may be a binary mask that does not use the phase shift effect, or a phase shift mask. The transfer mask may be a reticle.

The phase shift mask may be a phase shift mask of the halftone type (tri-tone type), the Levenson type, the assist pattern type, the self-aligned type (edge-enhanced type), or the like.

The above-mentioned various techniques can be applied to a mask blank for electron beam writing which is formed with a resist pattern by electron beam writing.

Example 1

Comparative Example 1

Manufacture of Mask Blank

Figure 5:
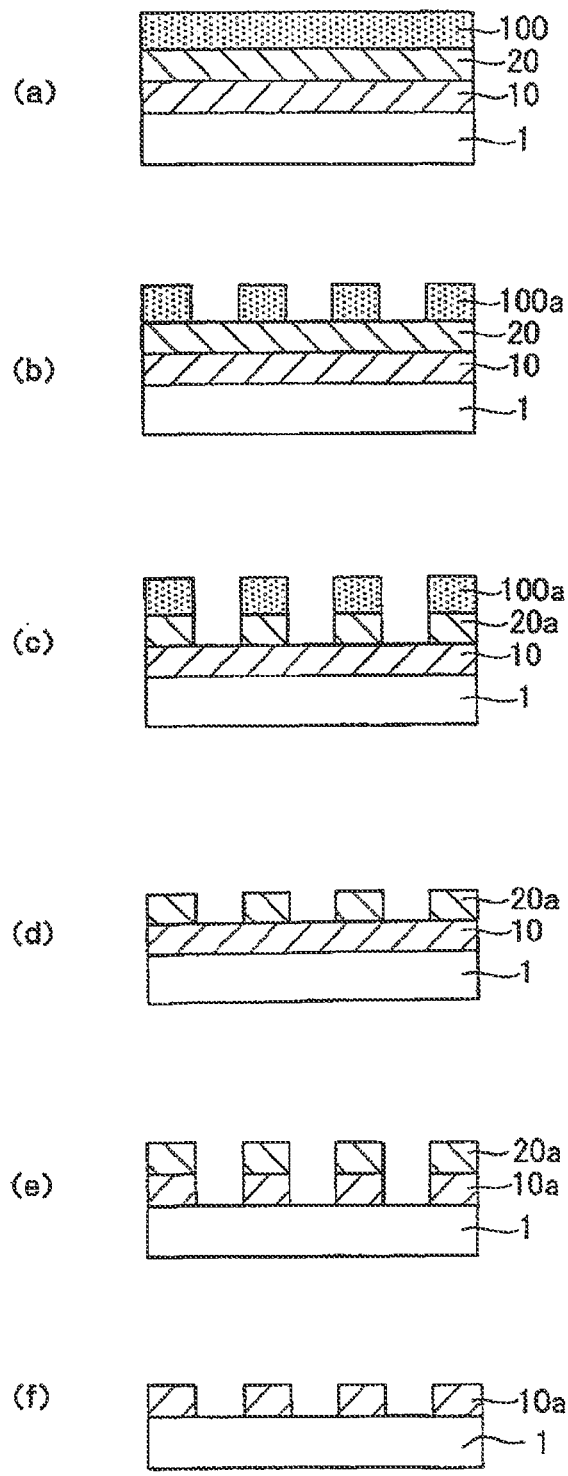
FIG. 5 is exemplary cross-sectional views for explaining processes of manufacturing a transfer mask according to an Example of this invention.

FIG. 5(a) is a cross-sectional view of a binary mask blank of Example 1.

Using a synthetic quartz glass substrate having a 6-inch square size with a thickness of 0.25 inches as a transparent substrate 1, a MoSiN film (light-shielding layer) and a MoSiON film (front-surface antireflection layer) were formed as a light-shielding film 10 being a pattern-forming thin film on the transparent substrate 1.

Specifically, using a mixed target of molybdenum (Mo) and silicon (Si) (Mo:Si=21 at %:79 at %), reactive sputtering (DC sputtering) was carried out in a mixed gas atmosphere of argon (Ar) and nitrogen ($N_2$), thereby forming a light-shielding layer (MoSiN film, Mo:Si:N=14.7 at %:56.2 at %:29.1 at %) to a thickness of 50 nm on the transparent substrate 1.

Then, using a mixed target of molybdenum (Mo) and silicon (Si) (Mo:Si=4 at %:96 at %), reactive sputtering (DC sputtering) was carried out in a mixed gas atmosphere of argon (Ar), oxygen ($O_2$), nitrogen ($N_2$), and helium (He), thereby forming a front-surface antireflection layer (MoSiON film, Mo:Si:O:N=2.6 at %:57.1 at %:15.9 at %:24.4 at %) to a thickness of 10 nm on the light-shielding layer.

The elements of the respective layers (light-shielding film) were analyzed by Rutherford backscattering spectrometry.

The total thickness of the light-shielding film 10 was set to 60 nm. The optical density (OD) of the light-shielding film 10 was 3.0 at the wavelength 193 nm of ArF excimer laser exposure light.

Then, the substrate was heat-treated (annealed) at 450° C. for 30 minutes.

Then, an etching mask film 20 being a chromium-based thin film was formed on the light-shielding film 10 (FIG. 5(a)).

Specifically, in a DC magnetron sputtering apparatus, using a chromium target, the film formation was carried out in a mixed gas atmosphere of argon (Ar), carbon dioxide ($CO_2$), nitrogen ($N_2$), and helium (He), thereby forming an etching mask film (CrOCN, Cr:O:C:N=33.0 at %:38.9 at %:11.1 at %:17.0 at %) to a thickness of 15 nm.

The elements of the CrOCN film (etching mask film) were analyzed by Rutherford backscattering spectrometry.

In the manner described above, a binary mask blank formed with the light-shielding film for ArF excimer laser exposure was obtained. Further, a required number of binary mask blanks were manufactured in the same manner.

Manufacture of Transfer Mask

On the etching mask film 20 of the mask blank, a chemically amplified positive resist 100 for electron beam writing (exposure) (PRL009: manufactured by FUJIFILM Electronic Materials Co., Ltd.) was coated to a thickness of 100 nm by a spin-coating method (FIG. 5(a)).

Then, using an electron beam writing apparatus, a desired pattern was written on the resist film 100 and, thereafter, development was carried out using a predetermined developer, thereby forming a resist pattern 100a (FIG. 5(b)).

Then, using the resist pattern 100a as a mask, the etching mask film 20 was dry-etched, thereby forming an etching mask film pattern 20a (FIG. 5(c)). A mixed gas of $Cl_2$ and $O_2$ ($Cl_2:O_2$=4:1) was used as a dry etching gas.

Then, the remaining resist pattern 100a was removed (FIG. 5(d)).

Then, using the etching mask film pattern 20a as a mask, the light-shielding film 10 was dry-etched using a mixed gas of $SF_6$ and He, thereby forming a light-shielding film pattern 10a (FIG. 5(e)).

Then, the etching mask film pattern 20a was stripped and removed by dry etching with a mixed gas of $Cl_2$ and $O_2$ ($Cl_2:O_2$=4:1) (FIG. 5(f)). The Cr stripping time was set to 25 seconds. Using all the above-mentioned manufactured binary mask blanks, transfer masks (binary masks) having the same transfer pattern were manufactured in the same manner.

Then, the transfer masks manufactured in the manner described above were subjected to a process of cleaning with alkaline solution, a process of cleaning with hot water, and a process of cleaning with ozone-containing water in this order.

The process of cleaning with alkaline solution used a solution of ammonium hydroxide ($NH_4OH$ concentration 25 wt %): hydrogen peroxide ($H_2O_2$ concentration 30 wt %): water ($H_2O$)=2:1:4 (volume ratio) at room temperature. The treatment time was set to 0 minutes (i.e. no treatment) in Comparative Example 1-1, 5 minutes in Comparative Example 1-2, 15 minutes in Example 1-1, and 30 minutes in Example 1-2.

The process of cleaning with hot water used ion-exchanged water (DI water: deionized water) at a temperature of 90° C. The treatment time was set to 0 minutes (i.e. no treatment) in Comparative Example 1-1, 5 minutes in Comparative Example 1-2, 15 minutes in Example 1-1, and 30 minutes in Example 1-2.

The process of cleaning with ozone-containing water used 50 ppm ozone-containing water at room temperature. The treatment time was set to 0 minutes (i.e. no treatment) in Comparative Example 1-1, 5 minutes in Comparative Example 1-2, 15 minutes in Example 1-1, and 30 minutes in Example 1-2.

In the manner described above, the transfer masks of Example 1-1, Example 1-2, Comparative Example 1-1, and Comparative Example 1-2 were respectively manufactured from the mask blanks.

Reference Example 1

Reference Example 1 was the same as Example 1 except that, in Example 1, a Cr-based etching mask film 20 was not formed on a MoSi-based light-shielding film 10 and the MoSi-based light-shielding film 10 was patterned using a resist pattern 100a as a mask.

Analysis by D-SIMS

With respect to the transfer masks obtained above, a residual substance was examined by secondary ion mass spectrometry (SIMS) in a dynamic mode (D-SIMS) (primary ions were $O_2$) adapted to measure a sample while shaving it. A measurement region was set to a region including lines and spaces.

As a result, the residual Cr concentration (atoms/cm$^3$) was $1.00 \times 10^{19}$ in Comparative Example 1-1 (i.e. no cleaning treatment), $1.09 \times 10^{18}$ in Comparative Example 1-1 (each cleaning time 5 minutes), $4.90 \times 10^{17}$ in Example 1-1 (each cleaning time 15 minutes), $1.69 \times 10^{16}$ in Example 1-2 (each cleaning time 30 minutes), and $5.00 \times 10^{15}$ in Reference Example 1 (no formation of Cr-based etching mask layer 20).

CD Variation Due to ArF Excimer Laser Irradiation

With respect to the transfer masks obtained above, the amount of CD variation due to irradiation of ArF excimer laser (wavelength 193 nm) was examined.

The irradiation conditions were set such that the repetition frequency was 300 Hz, the pulse energy was 16 mJ/cm$^2$, and the cumulative dose was 40 kJ/cm$^2$.

The cumulative dose of 40 kJ/cm$^2$ corresponds to exposure transfer of a transfer pattern to resist films of 150,000 wafers using a transfer mask.

Measurement of CD was such that the amount of CD variation (CD after irradiation—CD before irradiation) was measured for each of lines, at 6 portions, each having a width of 180 nm and arranged uniformly in the plane and then an average value was obtained.

As a result, the amount of CD variation (average value) was 19.5 nm in Comparative Example 1-1 (i.e. no cleaning treatment), 15.9 nm in Comparative Example 1-2 (each cleaning time 5 minutes), 4.7 nm in Example 1-1 (each cleaning time 15 minutes), 3.9 nm in Example 1-2 (each cleaning time 30 minutes), and 1.0 nm in Reference Example 1 (no formation of Cr-based etching mask film 20).

FIG. 1 shows the relationship between the residual Cr concentration (atoms/cm$^3$) and the amount of CD variation (nm) due to ArF excimer laser irradiation.

By reducing the chromium content of a surface layer (surface and sidewall portion) of the transfer pattern of the light-shielding film made of the MoSi-based material to less than $1.09 \times 10^{18}$ atoms/cm$^3$, the residual Cr concentration can be reduced by one digit and thus the CD variation (CD increase) can be reduced by half from 19.5 nm to about 10 nm as compared with Comparative Example 1-1 (i.e. no cleaning treatment). Thus, the effect is large.

By reducing the chromium content of a surface layer (surface and sidewall portion) of the transfer pattern of the MoSi-based light-shielding film to $5.00 \times 10^{17}$ atoms/cm$^3$ or less (less than $1.00 \times 10^{18}$ atoms/cm$^3$), the residual Cr concentration can be reduced to about $\frac{1}{50}$ and thus the CD variation (CD increase) can be reduced from 19.5 nm to 7.5 nm or less, i.e. to about $\frac{1}{3}$, as compared with Comparative Example 1 (i.e. no cleaning treatment). Thus, the effect is very large.

By reducing the chromium content of a pattern surface layer (upper surface and sidewall) of the MoSi-based light-shielding film to $3.40 \times 10^{17}$ atoms/cm$^3$ or less, the residual Cr concentration can be reduced by nearly two digits and thus the CD variation (CD increase) can be reduced from 19.5 nm to 4.7 nm, i.e. to about ¼, as compared with Comparative Example 1 (i.e. no cleaning treatment). Thus, the effect is still larger.

Reference Example 1 showed the best results about the CD variation due to the ArF excimer laser irradiation. However, in a pattern defect inspection, many pattern defects were found in the transfer pattern formed in the MoSi-based light-shielding film and thus it was unqualified for a transfer mask. This is considered to be caused by the occurrence of collapse or stripping of the resist pattern in the mask manufacturing processes.

The relationship between the residual Cl concentration in the region including lines and spaces and the implementation of the cleaning processes in Comparative Example 1-1 (i.e. no cleaning treatment), Comparative Example 1-2, Example 1-1, and Example 1-2 was examined. As a result, it was found out that there was no difference in residual Cl concentration due to the difference of the cleaning processes (even if the cleaning is carried out for a long time, the residual Cl concentration is not reduced and there is no change in FIG. 3). From this, it is considered that the possibility of the residual Cl concentration to affect the CD variation due to ArF excimer laser irradiation is small. In the D-SIMS of FIG. 3, Cs was used as primary ions.

Comparative Example 2

Comparative Example 2 was the same as Example 1 except that, in Example 1, an acid cleaning process was added before the process of cleaning with alkaline solution (i.e. after the etching removal of the etching mask film pattern 20a made of the chromium-based material, not the process of cleaning with alkaline solution, but the acid cleaning process is carried out) and the process of cleaning with ozone-containing water was omitted.

The acid cleaning process used a solution of sulfuric acid ($H_2SO_4$ concentration 98 wt %): hydrogen peroxide ($H_2O_2$ concentration 30 wt %)=4:1 (volume ratio) which was heated at 90° C. The treatment time was set to 10 minutes.

The amount of CD variation due to ArF excimer laser irradiation was examined under the same conditions as in Example 1. As result, the amount of CD variation (average value) of respective lines (uniformly arranged at 6 portions in the plane) was 11 to 19 nm.

Example 2

Example 2 was the same as Example 1 except that, in Example 1, a process of dry etching using a mixed gas of $Cl_2$ and $O_2$ ($Cl_2:O_2$=4:1) (treatment time 150 seconds) was added after the process of cleaning with ozone-containing water.

With respect to a transfer mask obtained in Example 2, the amount of CD variation due to ArF excimer laser irradiation was examined under the same conditions. As a result, the amounts of CD variation of respective lines (uniformly arranged at 6 portions in the plane) were each 2 nm or less.

Example 3

Example 3 was the same as Example 1 except that, in Example 1, the sequence of the process of cleaning with alkaline solution, the process of cleaning with hot water, and the process of cleaning with ozone-containing water was carried out twice (the conditions of the processes were the same as in Example 1).

With respect to a transfer mask obtained in Example 3, the amount of CD variation due to ArF excimer laser irradiation was examined under the same conditions. As a result, the amounts of CD variation of respective lines (uniformly arranged at 6 portions in the plane) were each 2 nm or less.

Comparative Example 3

Comparative Example 3 was the same as Example 1 except that, in Example 2, the stripping (cleaning) process of dry etching using a mixed gas of $Cl_2$ and $O_2$ ($Cl_2:O_2$=4:1) (treatment time 150 seconds) was carried out in place of the sequence of the process of cleaning with alkaline solution, the process of cleaning with hot water, and the process of cleaning with ozone-containing water.

With respect to a transfer mask obtained in Comparative Example 3, the amount of CD variation due to ArF excimer laser irradiation was examined under the same conditions. As a result, the amounts of CD variation of respective lines (uniformly arranged at 6 portions in the plane) were 2.7 to 22 nm and thus the variation was very large.

Example 4

Example 4 was the same as Example 1 except that, in Comparative Example 3, a process of cleaning with alkaline solution and a process of cleaning with hot water (the conditions of the processes were the same as in Example 1) were carried out after the stripping (cleaning) process of dry etching using a mixed gas of $Cl_2$ and $O_2$ ($Cl_2:O_2$=4:1) (treatment time 150 seconds).

With respect to a transfer mask obtained in Example 4, the amount of CD variation due to ArF excimer laser irradiation was examined under the same conditions. As a result, the amounts of CD variation of respective lines (uniformly arranged at 6 portions in the plane) were 2 to 5 nm.

Manufacture of Semiconductor Device

Then, transfer masks having a pattern-forming thin film formed with a transfer pattern of the DRAM hp45 nm generation were manufactured in the same manner as in Examples 1 to 3 and Comparative Examples 1 to 3. ArF excimer laser (wavelength 193 nm) was irradiated onto the pattern-forming thin film of each of the manufactured transfer masks under the same conditions as in Example 1. Accordingly, there were prepared the transfer masks each in a state where exposure transfer of its transfer pattern had been carried out on resist films of 150,000 semiconductor wafers. Using each of the prepared transfer masks, a process of exposure transfer of the transfer pattern was carried out on a resist film of a semiconductor wafer. An exposure apparatus used was of the immersion type having a light source of ArF excimer laser. Specifically, each of the prepared transfer masks was set on a mask stage of the exposure apparatus and then exposure transfer was carried out on a resist film for ArF immersion exposure on a semiconductor wafer. A predetermined development treatment was carried out on the resist film after the exposure, thereby forming a resist pattern. Further, using this resist pattern, a circuit pattern of the DRAM half-pitch (hp) 45 nm was formed on the semiconductor wafer.

The obtained circuit patterns of the semiconductor wafers were observed by an electron microscope (TEM). As a result, the circuit pattern which was formed using each of the transfer masks manufactured under the conditions of Examples 1 to 3 sufficiently satisfied the specification required for a circuit pattern of the DRAM half-pitch (hp) 45 nm. That is, it was confirmed that the transfer masks of Examples 1 to 3 could sufficiently transfer a circuit pattern of the DRAM half-pitch (hp) 45 nm with accuracy onto a semiconductor wafer even after carrying out exposure transfer for 150,000 semiconductor wafers.

In contrast, with respect to the circuit pattern which was formed using each of the transfer masks manufactured under the conditions of Comparative Examples 1 to 3, the amount of CD variation from the design value was large. Thus, these circuit patterns could not satisfy the specification required for a circuit pattern of the DRAM half-pitch (hp) 45 nm. That is, it was confirmed that the transfer masks of Comparative Examples 1 to 3 could not accurately transfer a circuit pattern of the DRAM half-pitch (hp) 45 nm onto a semiconductor wafer after carrying out exposure transfer for 150,000 semiconductor wafers. While this invention has been described with reference to the embodiment, this invention is not limited thereto. Various changes that can be understood by those skilled in the art can be made to the structures and details of this invention within the scope of this invention.

This application claims priority from Japanese Patent Application No. 2009-235817, filed on Oct. 12, 2009, the disclosure of which is incorporated herein in its entirety by reference.

DESCRIPTION OF SYMBOLS 1 transparent substrate
2 pattern-forming thin film
2a modified layer
10 light-shielding film
20 etching mask film
100 resist film

The invention claimed is:

1. A transfer mask having a transfer pattern formed in a pattern-forming thin film which is provided on a transparent substrate,
wherein,
the pattern-forming thin film is made of a material containing silicon and a transition metal other than chromium,
the transfer mask is manufactured using a mask blank in which the pattern-forming thin film and a chromium-based thin film made of a material containing chromium are laminated in this order on the transparent substrate, and
a chromium content in the pattern-forming thin film is less than $1.0 \times 10^{18}$ atoms/cm$^3$.

2. The transfer mask according to claim 1, wherein the transition metal in the pattern-forming thin film is molybdenum.

3. The transfer mask according to claim 1, wherein the pattern-forming thin film is a light-shielding film having an optical density of 2.5 or more with respect to exposure light.

4. The transfer mask according to claim 3, wherein the pattern-forming thin film is the light-shielding film having a laminated structure of at least two or more layers comprising a light-shielding layer and a front-surface antireflection layer from the transparent substrate side.

5. The transfer mask according to claim 1, wherein the pattern-forming thin film has the transfer pattern following a DRAM hp45 nm generation.

6. The transfer mask according to claim 1, wherein the pattern-forming thin film is a halftone phase shift film;
the chromium-based thin film forming a light-shielding band in a light-shielding band region around a transfer pattern region;
no chromium-based thin film being left on an upper surface of the pattern-forming thin film in the transfer pattern region.

7. The transfer mask according to claim 6, wherein a laminated constitution of the chromium-based thin film and the pattern-forming thin film has an optical density of 2.5 or more with respect to exposure light.

8. A method of manufacturing a semiconductor device, comprising forming a circuit pattern on a semiconductor wafer using the transfer mask according to claim 1.

9. The method of manufacturing a semiconductor device according to claim 8, wherein the circuit pattern formed on the semiconductor wafer includes a circuit pattern following a DRAM hp45 nm generation.

10. The transfer mask according to claim 1, wherein the transfer mask is adapted to be applied with exposure light having a wavelength of 200 nm or less.

11. The transfer mask according to claim 1, wherein the chromium-based thin film is not left on an upper surface of the pattern-forming thin film.

12. A method of manufacturing a transfer mask using a mask blank in which a pattern-forming thin film made of a material containing silicon and a transition metal other than chromium and a chromium-based thin film made of a material containing chromium are laminated in this order on a transparent substrate,
wherein the method produces the transfer mask by carrying out in the following order:
a step of forming a resist film having a transfer pattern on the chromium-based thin film;
a step of forming a transfer pattern in the chromium-based thin film using the resist film having the transfer pattern as a mask;
a step of forming a transfer pattern in the pattern-forming thin film using the chromium-based thin film having the transfer pattern as a mask; and
a step of removing the chromium-based thin film by etching, and
wherein the method further comprises a cleaning step of carrying out one or more of alkaline solution cleaning, hot water cleaning, and ozone-containing water cleaning on the produced transfer mask until a chromium content in the transfer pattern of the pattern-forming thin film becomes less than $1.0 \times 10^{18}$ atoms/cm$^3$.

13. The method of manufacturing a transfer mask according to claim 12, wherein the cleaning step carries out the alkaline solution cleaning, the hot water cleaning, and the ozone-containing water cleaning in this order.

14. The method of manufacturing a transfer mask according to claim 12, wherein the alkaline solution is an aqueous solution containing ammonia and hydrogen peroxide.

15. The method of manufacturing a transfer mask according to claim 12, wherein the transition metal in the pattern-forming thin film is molybdenum.

16. The method of manufacturing a transfer mask according to claim 12, wherein the pattern-forming thin film is a light-shielding film having an optical density of 2.5 or more with respect to exposure light, and
the chromium-based thin film is entirely removed in the step of removing by etching.

17. The method of manufacturing a transfer mask according to claim 16, wherein the pattern-forming thin film is the light-shielding film having a laminated structure of at least two or more layers comprising a light-shielding layer and a front-surface antireflection layer from the transparent substrate side.

18. The method of manufacturing a transfer mask according to claim 12, wherein the pattern-forming thin film has the transfer pattern following a DRAM hp45 nm generation.

19. The method of manufacturing a transfer mask according to claim 12, wherein the pattern-forming thin film is a halftone phase shift film,
a laminated structure of the chromium-based thin film and the pattern-forming thin film has an optical density of 2.5 or more with respect to exposure light, and
the chromium-based thin film is removed in its region other than a light-shielding band region around a transfer pattern region in the step of removing the chromium-based thin film by etching, thereby forming a light-shielding band.

20. A method of manufacturing a semiconductor device, comprising forming a circuit pattern on a semiconductor wafer using the transfer mask manufactured by the method of manufacturing a transfer mask according to claim 12.

21. The method of manufacturing a semiconductor device according to claim 20, wherein the circuit pattern formed on the semiconductor wafer includes a circuit pattern following a DRAM hp45 nm generation.

22. The transfer mask according to claim 12, wherein the transfer mask is adapted to be applied with exposure light having a wavelength of 200 nm or less.

23. A transfer mask having a transfer pattern formed in a pattern-forming thin film which is provided on a transparent substrate, wherein:
the pattern-forming thin film in a transfer pattern region is a halftone phase shift film;
the pattern-forming thin film in the transfer pattern region being made of a material containing silicon and a transition metal other than chromium, the chromium content in the pattern-forming thin film being less than $1.0 \times 10^{18}$ atoms/cm$^3$;
the chromium-based thin film, made of a material containing chromium, forming a light-shielding band on an upper surface of the pattern-forming thin film in a light-shielding band region around the transfer pattern region;
no chromium-based thin film being present on the upper surface of the pattern-forming thin film in the transfer pattern region.

24. The transfer mask according to claim 23, wherein the transfer mask is adapted to be applied with exposure light having a wavelength of 200 nm or less.

25. A method of manufacturing a semiconductor device, comprising forming a circuit pattern on a semiconductor wafer using the transfer mask according to claim 23.

\* \* \* \* \*